United States Patent
Herr et al.

(10) Patent No.: US 9,735,299 B2
(45) Date of Patent: Aug. 15, 2017

(54) REACTIVE CONDUCTIVE PRESSURE-SENSITIVE ADHESIVE TAPE

(75) Inventors: Donald Herr, Lancaster, PA (US); Brian A. Harkins, Dover, PA (US)

(73) Assignee: Adhesives Research, Inc., Glen Rock, PA (US)

( * ) Notice: Subject to any disclaimer, the term of this patent is extended or adjusted under 35 U.S.C. 154(b) by 1 day.

(21) Appl. No.: 13/989,087

(22) PCT Filed: Nov. 23, 2011

(86) PCT No.: PCT/US2011/061988
§ 371 (c)(1),
(2), (4) Date: May 29, 2013

(87) PCT Pub. No.: WO2012/071484
PCT Pub. Date: May 31, 2012

(65) Prior Publication Data
US 2013/0233485 A1  Sep. 12, 2013

Related U.S. Application Data

(60) Provisional application No. 61/416,385, filed on Nov. 23, 2010.

(51) Int. Cl.
*C09J 7/02* (2006.01)
*H01L 31/05* (2014.01)
(Continued)

(52) U.S. Cl.
CPC ........ *H01L 31/0512* (2013.01); *C09J 7/0264* (2013.01); *C09J 7/0292* (2013.01);
(Continued)

(58) Field of Classification Search
CPC ...... C09J 7/0292; C09J 7/0246; C09J 7/0217; C09J 2203/326
See application file for complete search history.

(56) References Cited

U.S. PATENT DOCUMENTS 4,814,208 A * 3/1989 Miyazaki ............... B05D 5/068
427/402
5,611,884 A * 3/1997 Bearinger et al. .......... 156/325
(Continued)

FOREIGN PATENT DOCUMENTS

CN  101031614 A  9/2007
CN  101160365 A  4/2008
(Continued)

OTHER PUBLICATIONS

"Momentive Epikure Epoxy Curing Agents" at website http://www.miller-stephenson.com/miller/pdf/curing%20agent.pdf.*
(Continued)

*Primary Examiner* — Scott W Dodds
(74) *Attorney, Agent, or Firm* — McNees Wallace & Nurick LLC

(57) ABSTRACT

A reactive pressure sensitive adhesive composition is disclosed. A tape formed using the reactive pressure sensitive adhesive is also disclosed. In its cured state, the pressure sensitive adhesive shows superior mechanical and electrical properties compared to conventional, non-curable charge collection tapes. The tape has a cure profile pre-selected to correspond to that of a photovoltaic cell fabrication process, such that curing can take place during cell fabrication and may occur simultaneously with one or more other curing steps employed in cell fabrication.

19 Claims, 2 Drawing Sheets

(51) Int. Cl.
*C09J 9/02* (2006.01)
*H01L 31/0224* (2006.01)
*C08K 3/04* (2006.01)
*C08K 3/08* (2006.01)

(52) U.S. Cl.
CPC ........ *C09J 9/02* (2013.01); *H01L 31/022425* (2013.01); *C08K 3/04* (2013.01); *C08K 3/08* (2013.01); *C09J 2201/602* (2013.01); *C09J 2203/322* (2013.01); *C09J 2205/102* (2013.01); *C09J 2400/163* (2013.01); *C09J 2433/00* (2013.01); *Y02E 10/50* (2013.01); *Y10T 428/252* (2015.01); *Y10T 428/256* (2015.01); *Y10T 428/287* (2015.01); *Y10T 428/2852* (2015.01); *Y10T 428/2857* (2015.01); *Y10T 428/2874* (2015.01); *Y10T 428/2887* (2015.01); *Y10T 428/2891* (2015.01); *Y10T 428/2896* (2015.01); *Y10T 442/10* (2015.04)

(56) References Cited

U.S. PATENT DOCUMENTS

| | | | |
|---|---|---|---|
| 6,126,865 A | 10/2000 | Haak et al. | |
| 6,348,118 B1* | 2/2002 | Johnson | C03C 27/048 156/246 |
| 6,861,138 B1 | 3/2005 | Pfaff et al. | |
| 6,887,917 B2 | 5/2005 | Yang et al. | |
| 7,820,265 B2 | 10/2010 | Husemann et al. | |
| 7,850,870 B2 | 12/2010 | Ahn et al. | |
| 2001/0007003 A1* | 7/2001 | Karim | C09J 7/0203 525/330.5 |
| 2008/0214079 A1* | 9/2008 | Harai | C09J 7/045 442/151 |
| 2009/0075008 A1 | 3/2009 | Hwang et al. | |
| 2009/0095517 A1* | 4/2009 | Nonaka et al. | 174/259 |
| 2009/0250109 A1* | 10/2009 | Hasegawa | C08K 5/1515 136/256 |
| 2010/0116314 A1 | 5/2010 | Fukushima et al. | |
| 2011/0214735 A1* | 9/2011 | Mahoney et al. | 136/256 |

FOREIGN PATENT DOCUMENTS

| | | |
|---|---|---|
| CN | 101376797 A | 3/2009 |
| CN | 101440263 A | 5/2009 |
| CN | 101675484 A | 3/2010 |
| EP | 1 347 027 A2 | 2/2003 |
| EP | 2 048 211 A2 | 4/2009 |
| EP | 2 146 355 A1 | 1/2010 |
| TW | 201025360 A | 7/2010 |
| WO | 2006/049792 A1 | 5/2006 |
| WO | 2006113488 A1 | 10/2006 |
| WO | 2010053859 A2 | 5/2010 |

OTHER PUBLICATIONS

"Air Products Epoxy Curing Agents" at website http://www.airproducts.com/~/media/files/pdf/products/epoxy-guide-na.pdf?la=en.*

"Cure Matters: Determining the Proper Cure Schedule" at website http://www.epotek.com/site/files/brochures/pdfs/Cure_Matters_Final.pdf.*

"3M Grounded Heat Sink Bonding Film", Technical Data, Sep. 2001, pp. 1-4.

* cited by examiner

REACTIVE CONDUCTIVE PRESSURE-SENSITIVE ADHESIVE TAPE

CROSS-REFERENCE TO RELATED APPLICATIONS

This application claims priority to U.S. Application No. 61/416,385, filed Nov. 23, 2010, which is hereby incorporated by reference in its entirety.

BACKGROUND

Conductive adhesives can be used to form electrical interconnection between two conductive materials. Many applications exist for such adhesives including electrical grounding for handheld devices, electromagnetic shielding, and die attach adhesives. For many such applications a conductive paste or a conductive film might be used, depending on specific performance and application details.

However, in any conductive joint, whether formed by a conductive adhesive or other material, electrical reliability is a concern. Stable electrical performance should be exhibited over extended periods even in the face of exposure to harsh conditions, which can be replicated in a controlled setting through accelerated conditioning using bias humidity testing, hygrothermal aging, and thermal cycling. A reliable electrical interconnect should exhibit little or no change in resistance over time under harsh conditions.

One example of an application that depends upon high electrical reliability and low electrical joint resistance is a charge collection tape for use within a photovoltaic (e.g., solar) cell. Such tapes can be used to capture a charge being generated within the cell and then to carry it to external electrical circuitry. Examples of regions within a photovoltaic cell where charge collection tapes might be used include the charge collection grid, ribbon connections between cells, and busbars connecting positive and negative charge collection electrodes to external circuitry. The benefits of conductive tape are a generally well-defined bondline, efficient and rapid adhesive tape application (often in a roll to roll/web process), and cost efficiency.

High reliability of electrical interconnects within a solar cell is important to maintaining the long expected functional lifetime of such a device. Most solar panels are rated to perform for 20-30 years at high efficiencies. As such, highly reliable/robust electrical interconnects and conductive adhesives are likely to be important in maintaining performance targets across long lifetimes.

One class of conductive adhesive used in electrical interconnects is conductive pressure sensitive tapes. A typical tape utilizes a metal foil backing coated with an electrically conductive adhesive composition. A typical conductive adhesive composition comprises a pressure sensitive adhesive (PSA) resin matrix filled with conductive particles that either individually bridge the bondline or form a percolation network that bridges the bondline. Such metal-backed conductive PSA tapes are typically referred to as "charge collection tapes."

Resins used for conductive PSAs are soft materials with a shear modulus below about $3 \times 10^5$ Pa when measured at a rate of 1 radian/second, which is related to their ability to serve as a pressure sensitive composition. As such, PSA resins are viscoelastic systems that exhibit a certain degree of molecular level flow/viscous character. The viscous character of conventional non-reactive PSAs can affect joint resistance and joint reliability when used in conductive PSA tapes if the tape becomes sufficiently stressed. In particular, high temperatures further soften known conductive PSAs, increasing their tendency to flow.

Other known solutions are also unsatisfactory for a variety of reasons. Pastes do not provide adequate strength for handling until they are thermally cured. Heat seals require either heat tacking or full thermal curing with pressure in order to develop significant bond strength.

There is a need for more electrically reliable materials for applications which are subjected to extreme environmental conditions. Thus, there remains a need for materials that exhibit high reliability and high conductivity (i.e., low joint resistance) under harsh conditions and high temperatures.

SUMMARY

In one embodiment, a reactive conductive adhesive tape comprises a reactive adhesive layer and an electrically conductive substrate. The adhesive layer includes a curable pressure sensitive adhesive and a conductive filler and the layer is laminated on and in contact with the electrically conductive substrate. The cure profile of the adhesive layer is pre-selected to correspond to that of a photovoltaic cell fabrication process.

In another embodiment, a reactive conductive pressure sensitive adhesive composition comprises a curable pressure sensitive adhesive and a conductive filler in which the adhesive composition has a peel strength greater than about 25 oz per inch of width (about 2.7 N/cm) in the uncured state after application at room temperature.

In yet another embodiment, a method of constructing a photovoltaic cell comprises applying a reactive conductive adhesive tape as described herein as an electrical interconnect to a photovoltaic cell followed by curing the adhesive layer of that tape during fabrication of the photovoltaic cell.

An advantage of exemplary embodiments is that a chemically reactive conductive PSA tape is provided that can produce more reliable electrical interconnects than traditional conductive pressure sensitive charge collection tapes, while still providing the PSA benefits of instantaneous, low pressure room temperature bond formation.

Another advantage is that reactive conductive PSA tapes in accordance with exemplary embodiments are provided that cure to a more elastic, less viscous state than typical conductive PSA tapes and can thereby produce improved electrical reliability when used in photovoltaic cells and other devices.

Yet another advantage is that the reactive conductive PSA tapes in accordance with exemplary embodiments have a cure profile that corresponds to that of a photovoltaic cell fabrication process so that the curing step does require exposure to curing conditions that would cause damage to the photovoltaic cell or its components. It can further allow for the PSA to cure simultaneously with one or more other curing steps in the cell fabrication process, reducing the total time and number of manufacturing steps need to construct the cell. Additional discrete cure and/or heat tacking steps are not required.

Other features and advantages of the present invention will be apparent from the following more detailed description of exemplary embodiments, taken in conjunction with the accompanying drawings which illustrate, by way of example, the principles of the invention.

DETAILED DESCRIPTION OF EXEMPLARY EMBODIMENTS

Figure 1:
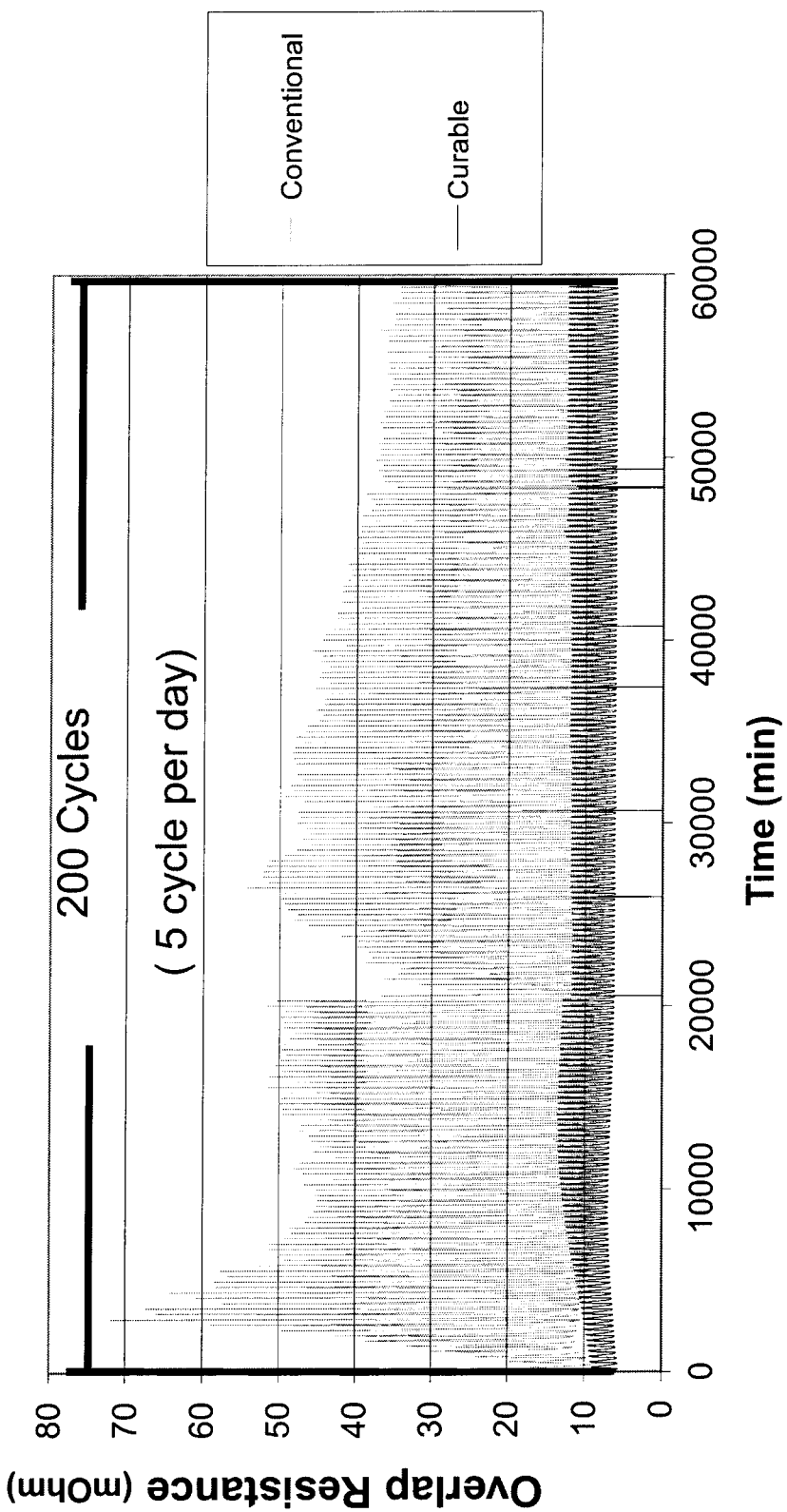
FIG. 1 graphically illustrates change in resistance with respect to time during thermal cycling for a tape in accordance with an exemplary embodiment and a conventional charge collection tape.

For photovoltaic cell applications, a reactive conductive PSA tape can be used as a charge carrier tape and may be cured during cell fabrication without a separate processing step. A tape is provided with a pressure sensitive adhesive formulation that can be cured during conditions of a processing step already existing as part of cell fabrication, such as that used to cure cell encapsulation materials. Reactive conductive PSA tapes in accordance with exemplary embodiments are provided which cure during these and/or other encapsulation thermal profiles used during cell fabrication. Such tapes also provide improved electrical reliability in comparison to known non-curable conductive charge collection tapes.

Reactive adhesive formulations for use with reactive conductive PSA tapes in accordance with exemplary embodiments are curable formulations that include one or more base polymers that are pressure sensitive adhesives mixed with a conductive filler. In some embodiments, the PSA formulation has a pre-cure glass transition temperature ($T_g$) in the range of about −50° C. to about −10° C. The post-cure $T_g$ remains low, typically below 0° C. As a result, the cured adhesive exhibits good peel strength, but remains soft and tough enough to withstand thermal cycling and other harsh environmental conditions over long periods of time such as those experienced by photovoltaic cells. The use of reactive conductive PSA tapes in accordance with exemplary embodiments further provides benefits such as immediate room temperature, low pressure assembly and fixturing, which cannot be achieved with conductive pastes or heat seals.

The pressure sensitive adhesive may comprise any suitable reactive polymer that can be cured, either by itself or in the presence of one or more crosslinking components. Alternatively, the pressure sensitive adhesive may include a non-reactive polymer blended with one or more crosslinking components (e.g. a multifunctional monomer, oligomer, or polymer) to form a curable PSA formulation. Blends of such reactive and non-reactive polymers may also be used.

Exemplary reactive polymers that may be used as the base polymer of the adhesive formulation include acrylic copolymers that incorporate epoxy, carboxylic acid, amine, mercaptan, amide, isocyanate, cyanate ester, allyl, maleimide, acrylate, oxetane, silicone hydride, alkoxysilane, or other reactive groups pendant to the polymer backbone or within the polymer backbone. Exemplary reactive monomers used for acrylic PSA polymers include glycidyl methacrylate, hydroxyethyl acrylate, allyl methacrylate, isocyanatopropyl acrylate, N-vinylpyrollidone, and acrylic acid. Other well known functional acrylate monomers may also be used.

Exemplary non-reactive polymers include polymers formed from acrylates such as butyl acrylate, methyl acrylate, ethylhexyl acrylate, isooctyl acrylate, and methyl methacrylate.

The adhesive formulation can also include non-acrylic polymers as the base polymer alone or in combination with acrylic polymers. Both reactive and non-reactive non-acrylic polymers may be used in the formulation. Suitable non-acrylic polymers for use in accordance with exemplary embodiments include, without limitation, phenolic resins, aliphatic polyesters, aromatic polyesters, polyether polyols, polyester polyols, amine-functional acrylonitrilebutadiene copolymers, carboxylic acid-functional acrylonitrilebutadiene copolymers, polyurethanes, polyamides, rubberized epoxy prepolymers such as carboxyl-terminated liquid butadiene acrylonitrile (CTBN)-epoxy adducts, and hydroxyl-functional acrylonitrilebutadiene polymers.

The reactive or non-reactive base polymers may be obtained commercially or may be synthesized. For example, acrylic reactive polymers may be synthesized by free-radical polymerization of monomers in the presence of a solvent. In such cases, any suitable free radical initiator may be used; exemplary initiators include, but are not limited to, peroxy and/or azo compounds. Polyester, polyurethane, CTBN-epoxy adducts, olefinic and rubber polymers, rubber block copolymer, and other base polymers can similarly be purchased or synthesized by known methods.

Crosslinking components are blended with non-reactive base polymers to provide a reactive adhesive formulation, although crosslinking components may also be used in combination with reactive base polymers to provide a curable formulation. Typical crosslinking components are those which include epoxy, acrylate, oxetane, maleimide, alcohol, mercaptan, isocyanate, cyanate ester, alkoxysilane, silicon-hydride, allyl, and benzoxazine functionalities. The crosslinking components containing such reactive groups may be present as monomers, multifunctional resins, oligomers, or polymers.

One suitable class of crosslinking components includes oligomers such as aliphatic and aromatic urethane acrylates. Another suitable class includes aliphatic and aromatic epoxy resins. In some cases, epoxy resins which are not soluble in the base polymer, and thus exhibit improved latency, may be used. Other reactive components for use as crosslinking components include, but are not limited to, multifunctional alcohols, multifunctional acrylate resins, and multifunctional isocyanates (sometimes in the form of a chemically blocked isocyanate). While the selection of crosslinking components is not limited to specific cure chemistries, exemplary embodiments specifically contemplate formulations that can be cured by a radical cure, hydroxyl-blocked isocyanate cure, epoxy-latent amine cure, and an insoluble epoxy-amine cure, by way of example.

The amount of crosslinking component may be between about 0.1% by weight to about 70% by weight of the organic solids content of the formulation (i.e., excluding solvent and fillers), depending on the level of cure sought to be achieved and whether or not the crosslinking component is used in combination with an already reactive polymer or with a non-reactive polymer. More typically, the crosslinking component is about 0.5% by weight to about 20% by weight of the organic solids content of the formulation.

The reactive or non-reactive polymer(s) and/or the crosslinking component(s) for use with a particular formulation in accordance with exemplary embodiments may depend upon the curing conditions that will be employed and to which the reactive conductive PSA tape will be exposed. As discussed, the cure profile may be pre-selected to correspond to that of a photovoltaic cell fabrication process and/or a particular step within that fabrication process. In some cases, there may be multiple instances during, for example, photovoltaic cell fabrication that employ a thermal profile that could result in curing, depending on the curing characteristics of the adhesive formulation used to make the tape. In such cases, the formulation may be selected so that the cure occurs in conjunction with a particular thermal profile that will be employed at a particular point during the fabrication. One such example is the thermal profile already used to cure cell encapsulation materials such as ethyl vinyl acetate (EVA) or polyvinyl butyral (PVB) during cell fabrication, which typically includes a thermal cure profile of 10-15 minutes at 150-170° C.

The PSA component of the adhesive formulation, including any crosslinking component, is mixed thoroughly with a conductive filler, optionally using a solvent to facilitate mixing, to form the reactive conductive adhesive formulation that will be applied to the tape. The conductive filler may be present as about 0.1% by weight to about 90% by weight solids of the total adhesive formulation (i.e. excluding the mass of any optional solvents). Conductive fillers include metals such as silver, gold, nickel, copper; carbon black; carbon fiber; metalized carbon fiber, as well as metal coated glass beads, metal coated glass flakes/fibers, and metal coated nickel particles, all by way of example. The metal coating can be any conductive metallic material such as silver, gold, copper, etc. The particle shape is not limited, and may include spheres, flakes, and irregularly shaped particles. Likewise, particle size is not limited, and may include sizes well below the thickness of the adhesive film up to particles large enough to span the entire bondline thickness of the film.

It will be appreciated that conventional additives used with other known PSA formulations for various purposes may also be employed.

If a solvent is used, it is generally a common solvent. If desired for processing purposes, the viscosity of the formulation can be adjusted by adding or removing solvent. If a solvent is employed, any suitable solvent may be used, including ethyl acetate, toluene, hydrocarbons such as heptane or hexane, alcohols, and combinations thereof, all by way of example only.

The adhesive formulation, including the base polymer, any crosslinking components, conductive filler, any other fillers, and optional solvent, can then be coated on any suitable substrates including polyethylene terephthalate (PET) film, polyimide film, polyurethane film, and polyethylene film by way of example only. However, for electrical applications such as photovoltaic cell fabrication, for example, the adhesive formulation is generally used in combination with a metallic or other electrically conductive substrate, such as tin-coated copper foil, for example. Other suitable conductive substrates include aluminum foil, copper foil, metalized plastics and conductive scrim, all by way of example only.

A release liner, such as a silicone release liner, may then be laminated over the adhesive until the film is ready to be applied, at which point the release liner can be removed to expose the adhesive. Ordinarily, in embodiments in which the adhesive is used in combination with a metallic foil, it may be desirable to apply the adhesive solution to the release liner first, followed by drying to remove excess solvent, and thereafter laminating the adhesive/liner combination to the foil using a roller or similar device to form the reactive conductive PSA tape.

The tape can then be attached to a photovoltaic cell or other interconnected electrical device at room temperature and ordinary pressure and thereafter cured to initiate and carry out crosslinking within the formulation, while the conductive filler remains suspended therein. Tapes formed in accordance with exemplary embodiments can be used in various types of photovoltaic cells/solar cells, including crystalline Si, polycrystalline Si, inorganic thin film (e.g. CdTe, CIGS, etc.), and organic photovoltaic cells. These cells may be rigid or flexible depending on their intended end use. The type of photovoltaic cell and its intended end use may have a bearing on the thermal profiles used during cell fabrication which may, in turn, result in the particular polymers and crosslinking components being pre-selected for the tape so that the cure profile of the adhesive corresponds to the thermal profile of the cell fabrication.

The use of a pressure-sensitive adhesive with tapes in accordance with exemplary embodiments result in an aggressive tack in the uncured state. The tape when applied (i.e. prior to curing) has a peel strength of at least 25 oz/inch width (about 2.7 N/cm width), typically greater than about 40 oz/inch width (about 4.3 N/cm width). As a result, once applied, there is little risk that the tape will move or become unstuck during other cell fabrication steps prior to curing, even if the cell is subjected to significant handling and/or manipulation. After curing, the adhesive still exhibits good peel strength, typically having a post-cure peel strength of at least 25 oz/inch width (about 2.7 N/cm width). Because the cured adhesive retains a low $T_g$, the tape can also withstand repeated thermal cycling. Thus, exemplary embodiments provide desirable mechanical properties for use in aggressive environments, in addition to demonstrating consistent electrical performance over time in those environments as shown in more detail in the context of the following examples.

EXAMPLES

The invention is further described by way of the following examples, which are presented by way of illustration, not of limitation.

Example 1

Example 1 illustrates an embodiment of a reactive conductive PSA based on a curable acrylic base polymer and a radically curable crosslinking component. A pressure sensitive adhesive composition was formulated as noted in Table 1, in which parts are by weight.

TABLE 1

| Item Description | Quantity (ppH) |
|---|---|
| Epoxy, carboxylic acid functional acrylic polymer | 41.0 |
| Hydrophobic aliphatic Urethane acrylate oligomer | 3.7 |
| Urethane acrylate oligomer | 10.3 |
| Dibenzoyl peroxide | 0.1 |
| Silver coated nickel particles | 21.9 |
| Ethyl acetate | 23.0 |

The glass transition temperature ($T_g$) for the adhesive thus formulated was determined by differential scanning calorimetry (DSC) to be −23° C. in the uncured state, with a $T_g$ of −24° C. in the cured state, which is favorable for reliable performance during the thermal cycling that occurs in a photovoltaic cell during its use under harsh conditions. The low $T_g$, flexible adhesive can deform and compensate for stresses that develop during thermal cycling (for example, due to coefficient of thermal expansion (CTE) mismatches) and general use. However, after curing, it will not permanently flow or creep as may occur with a non-reactive PSA.

The adhesive formulation shown in Table 1 was applied to a 2 mil (0.002 in.) silicone release liner and dried at 65° C. for 5 minutes to obtain a 1.5 mil (0.0015 in.) thick adhesive layer on the release liner. The adhesive was thereafter laminated to a 1.4 mil (0.0014 in.) tin coated copper foil with approximately 80-100 psi using a laminating roller to create a reactive conductive PSA tape construction.

Strips of this construction were placed in a 150° C. oven for 10 minutes with the release liner in place to exclude oxygen. The samples were then removed and allowed to cool to room temperature. Tack of these samples was evaluated before and after heat exposure and the following was observed:

Example 1 before thermal cure—Very aggressive tack
Example 1 after thermal cure—Slight to no tack Overlap joints were prepared by overlapping a 0.5 in. by 1.4 mil thick tin coated copper foil with a 0.25 in. wide strip of the tape construction made according to Example 1. The samples were cured at 150° C. for 10 minutes under 25 psi to simulate a typical EVA encapsulation condition for photovoltaic modules. The samples were allowed to cool to room temperature.

After curing, the samples were then tested by measuring resistance against an applied current. The current was gradually increased from 1 to 10 amps, held at 10 amps for 2 minutes, and then brought back down to 1 amp. During testing, the voltage across the joint was recorded at 1, 5 and 10 amp intervals and the resistance then calculated according to Ohm's Law. An identical test was carried out with a commercially available non-reactive charge collection tape. Results are shown in Table 2.

TABLE 2

| Sample | Sample Design | Measurement | 1 amp | 5 amp | 10 amp |
| --- | --- | --- | --- | --- | --- |
| Example 1 Construction | Overlap Joint | Ramp Up Voltage (mVDC) | 0.107 | 0.544 | 1.095 |
| Example 1 Construction | Overlap Joint | Ramp Down Voltage (mVDC) | 0.107 | 0.549 | 1.104 |
| Conventional Charge Collection Tape | Overlap Joint | Ramp Up Voltage (mVDC) | 10.000 | 50.571 | 101.724 |
| Conventional Charge Collection Tape | Overlap Joint | Ramp Down Voltage (mVDC) | 11.223 | 49.341 | 95.783 |
| Example 1 Construction | Overlap Joint | Ramp Up Resistance (mohm) | 0.1070 | 0.1088 | 0.1095 |
| Example 1 Construction | Overlap Joint | Ramp Down Resistance (mohm) | 0.1070 | 0.1098 | 0.1104 |
| Conventional Charge Collection Tape | Overlap Joint | Ramp Up Resistance (mohm) | 10.0000 | 10.1142 | 10.1724 |
| Conventional Charge Collection Tape | Overlap Joint | Ramp Down Resistance (mohm) | 11.2230 | 9.8682 | 9.5783 |
| Example 1 Construction | Overlap Joint | % Change in Resistance | 0.000% | 0.919% | 0.822% |
| Conventional Charge Collection Tape | Overlap Joint | % Change in Resistance | 12.230% | 2.432% | 5.840% |

Using the same experimental set up and curing conditions, samples of the tape construction of Example 1 and those of a conventional charge collection tape were placed into a 120° C. oven while passing a continuous current of 10 amps. The voltage was measured and recorded over a period of time. Changes in resistance over time were then calculated according to Ohm's Law, the results of which are shown in Table 3.

TABLE 3

| Time (min) | Example 1 Construction Voltage (mVDC) | Conventional Charge Collection Tape Voltage (mVDC) | Example 1 Construction Resistance (mohm) | Conventional Charge Collection Tape Resistance (mohm) |
| --- | --- | --- | --- | --- |
| 0 | 0.591 | 189.846 | 0.059 | 18.985 |
| 1 | 0.591 | 228.1 | 0.059 | 22.810 |
| 5 | 0.651 | 201.74 | 0.065 | 20.174 |
| 10 | 0.678 | 164.44 | 0.068 | 16.444 |
| 20 | 0.676 | 49.82 | 0.068 | 4.982 |
| 30 | 0.667 | 50.005 | 0.067 | 5.001 |
| Total % Change in Resistance: | | | 12.86% | −73.66% |

Using the same experimental set up and curing conditions, samples of the tape construction of Example 1 and those of a conventional charge collection tape were placed into an environmental chamber and thermal cycled between −40° C. and 85° C. according to the International Electrotechnical Commission's standard test for Thin-film terrestrial photo-voltaic modules—Design qualification and type approval (identified as IEC 61646), while passing a continuous current of 1.5 amps. The voltage was measured and recorded over a period of time. The resistance was calculated according to Ohm's Law and changes in resistance were plotted with respect to time, the results of which are shown in FIG. 1.

As illustrated in Tables 2 and 3 and shown in FIG. 1, exemplary embodiments showed a substantially lower increase in resistance over changing current conditions, temperature cycling, and over time compared to the conventional alternative—a charge collection tape having a non-curable pressure sensitive adhesive. A significant resistance change (such as shown in the comparative example) suggests instability at the overlap joint. The decrease in resistance in this case is believed to be a function of increased flow of the adhesive formulation as it is heated and the resulting improvement in surface wetting. The fact the uncured adhesive of the comparative example is so susceptible to flow at elevated temperature suggests it is less stable and less capable of maintaining electrical interconnect when heated. Conversely, the construction of Example 1 showed little change in resistance that suggests its mechanical and electrical properties are stable even after conditioning.

Example 2

Example 2 illustrates a reactive conductive PSA formed from a hydroxy-functional acrylic PSA polymer base resin and a blocked isocyanate crosslinking component. A solvent-borne conductive PSA was formed by dissolving a hydroxyl-functional acrylic polymer (27 g, 90 parts by weight ethylhexyl acrylate, 10 parts by weight hydroxyethyl acrylate, Mn~250K, Mw~550K) and blocked isocyanate solution Trixene BI-7982 (4 g, DMP-blocked HDI trimer from Baxenden Chemical) in ethyl acetate (70 g). To this solution were slowly added nominally 35 μm Ag-coated glass beads (15 g, Conduct-O-Fil TP35-S12 from Potters Industries) with stirring using a mechanical blade mixer.

This solution was coated on a 2 mil PET release liner using a bar drawdown coater to form an approximately 38 μm thick film after drying for 5 minutes at 65° C. to yield a tacky, uncured PSA film on the release liner.

This film was laminated to a 36 micron tin-coated copper foil substrate using a lamination pressure of 40 psi. The release liner was removed from the resulting adhesive coated foil, and the foil-backed PSA was cured using a cure profile of 15 minutes at 150° C. to simulate a typical EVA encapsulant thermal curing profile. During this curing step, the blocked isocyanate was de-protected to produce a multifunctional isocyanate resin that reacts with the hydroxyl functionality of the acrylic polymer. After thermal curing, the reactive PSA exhibited essentially no tack in the crosslinked state.

Example 3

Like Example 2, Example 3 is another illustration of a reactive conductive PSA formed from a hydroxy-functional acrylic PSA polymer base resin and a blocked isocyanate crosslinking component. A curable conductive PSA similar to that described in Example 2 was formulated by combining a hydroxyl-functional acrylic PSA base resin (8.9 g of polymer in 13.4 g ethyl acetate solvent), a dimethylpyrazole (DMP)-hexamethylene diisocyanate (HDI) trimer adduct blocked isocyanate curing agent (1.1 g adduct in 1.1 g methyl ethyl ketone solvent), and Ag-coated glass beads (2.1 g) with agitation using a vortex mixer. This adhesive was coated on a release liner using a drawdown bar and dried in a convection oven to yield a 1.7 mil thick dried adhesive film. This film was laminated to a Sn-coated Cu foil backing using a lab roller.

One inch wide strips of this laminate were cut, the release liner was removed, and the strips were laminated to stainless steel test panels in accordance with PSTC method PSTC-101 and ASTM method D-3330 and subsequently peeled using a peel rate of 12 inches/minute. One set of samples were tested for 1 h peel force after a 1 h dwell at ambient conditions (uncured samples). A second set of samples were subsequently cured for 15 minutes at 170° C. in a convection oven prior to measuring peel force (cured samples).

The average peel force of the uncured adhesive was 58 oz./inch width. The average peel force for the cured samples was 26 oz./inch width. The uncured peel force is high for a filled conductive PSA and facilitates fixturing and handling of the uncured material in a photovoltaic cell assembly process. Although the peel strength of the cured adhesive was lower than the uncured value, it is adequate for use with high reliability in an encapsulated solar panel. The change in peel force demonstrates that the adhesive cures extensively during the simulated photovoltaic cell encapsulation thermal profile.

The glass transition temperature ($T_g$) for the adhesive of Example 3 was also determined by differential scanning calorimetry (DSC). The $T_g$ was determined to be −31° C. in the uncured state and it maintained a $T_g$ of −31° C. after curing. As described in Example 1, retention of a low $T_g$ after curing is favorable for reliable performance during the thermal cycling that occurs in a photovoltaic cell during its use under harsh conditions that permit it to deform and compensate for stresses that develop during thermal cycling but without exhibiting permanent flow or creep.

Example 4

Example 4 illustrates an embodiment using a reactive conductive PSA formed from an acrylic polymer PSA base resin and using a latent insoluble solid epoxy crosslinking component. A solvent-borne conductive PSA is formed by dispersing 10 g tris(epoxypropyl) isocyanurate powder (TEPIC) (obtained from TCI America) and 5 g dicyandiamide solid powder (DICY) (obtained as Dicyanex 1400B from Air Products) in 212.5 g of an ethyl acetate solution of an epoxy-functional acrylic pressure sensitive adhesive having 85 g polymer solids including 5 wt. % glycidyl methacrylate included in monomer feed during acrylic polymer synthesis. To this dispersion are slowly added nominally 35 μm Ag-coated glass beads (30 g, Conduct-O-Fil TP35-S12 from Potters Industries) with stirring using a mechanical blade mixer.

This dispersion is coated on a 2 mil PET release liner using a bar drawdown coater to form an approximately 38 μm thick film and is then dried for 5 minutes at 65° C. to yield a tacky, uncured PSA film on the release liner. The TEPIC/DICY reactive components do not cure during the dry-down process due to the use of a low drying temperature and the insolubility of these components in the acrylic polymer.

The film is then laminated to a 36 micron tin-coated copper foil carrier using a lamination pressure of 40 psi. The release liner is removed from the resulting adhesive coated foil, and the foil-backed PSA is cured using a cure profile of 15 minutes at 170° C. to simulate a typical EVA encapsulant thermal curing profile. During this curing step the TEPIC and DICY can dissolve/melt into the base epoxy-functional acrylic resin system while curing to yield a thermoset matrix after cure. After thermal curing, the conductive adhesive exhibits low tack in the crosslinked (i.e. cured) state.

Example 5

The reactive conductive tape made in Example 2 was compared to a non-reactive charge carrier tape benchmark by creating an encapsulated overlap joint. Joints were prepared on a glass substrate by overlapping a 0.5 in. wide by 1.4 mil thick tin coated copper foil with a 0.25 in. wide strip of the reactive tape construction made according to Example 2. A layer of polymer encapsulant was placed onto the joint, followed by a second plate of glass. The multilayer structure was heat laminated at 150° C. for 10 minutes under pressure to simulate a solar cell encapsulation process. A similar overlap joint was constructed using a non-reactive charge carrier tape benchmark. The samples were allowed to cool to room temperature. The resistance of the overlap joint was measured at 1, 5, and 10 amp current flow ("ramp up" data), followed by holding the joint for a period of 60 minutes at 10 amp current flow. The resistance of the joint was then again measured as the current was stepped down from 10 to 5 to 1 amp ("ramp down" data). Results are shown in Table 4 below.

TABLE 4

| Sample | Applied Amperage (A) | Joint Resistance/ Ramp Up (milliohm) | Joint Resistance/ Ramp Down (milliohm) | % change in resistance after 10 amp/1 hour |
|---|---|---|---|---|
| Example 2 | 1 | 7.4 | 7.8 | |
| Example 2 | 5 | 7.4 | 7.8 | |
| Example 2 | 10 | 7.5 | 7.9 | 5.1 |
| Conventional Charge Collection Tape | 1 | 7.6 | 8.0 | |
| Conventional Charge Collection Tape | 5 | 7.6 | 8.1 | |
| Conventional Charge Collection Tape | 10 | 7.7 | 8.1 | 6.1 |

The reactive tape produced in accordance with the exemplary embodiment demonstrated a joint of lower overall resistance under all conditions studied. Also, the stability/reliability of the joint can be assessed by how much or how little the resistance changes after the one hour soak under 10 amp bias. The tape of Example 2 exhibited a 5.1% increase in resistance during this bias testing, whereas the non-reactive conventional charge collection tape resistance increased by 6.1%. These results indicate that the cured joint formed using the adhesive of Example 2 is more stable under high bias conditions relative to the non-reactive adhesive benchmark.

Example 6

The adhesive formulation reflected in Table 1 of Example 1 was applied to a 2 mil (0.002 in.) silicone release liner and dried at 65° C. for 5 minutes to obtain a 1.5 mil (0.0015 in.) thick adhesive layer on the release liner. A second 2 mil (0.002 in.) silicone release liner was laminated to the exposed adhesive surface.

Samples were cut to 2.54 cm by 15.24 cm (1 in. by 6 in.) strips. A first liner was removed and the samples were laminated to a 15.24 cm by 15.24 cm (6 in. by 6 in.) 316 stainless steel panel using a 4.5 lb roller. The second liner was removed and 0.23 mm thick tin coated copper (Sn—Cu) strips (3.05 cm by 30.48 cm (1.2 in. by 12 in.)) were laminated to the exposed adhesive with a 4.5 lb roller. Samples were then tested on an MTS peel adhesion tester to measure peel force. Consistent with industry peel testing standards, the samples were pulled at 90 degrees from the panel at a rate of 30.48 cm/min (12 in./min.).

Peel force was measured for samples in the uncured state and after curing; to ensure a full cure, the samples were cured for 14 minutes at 160° C. Pre-cure peel force measurements ranged from 5.7 N/cm to 7.3 N/cm. Post-cure peel measurements ranged from 22.0 N/cm to 22.7 N/cm.

Example 7

The curable conductive PSA described in Example 3 was compared to a typical non-curable conductive PSA through the use of accelerated testing by cycling ("T-cycling") encapsulated lap joint samples from −40° C. to 85° C. using a method consistent with the UL1703 protocol for solar panel testing.

Lap joints were formed on a glass microscope slide using a 0.5" wide bottom Sn-coated Cu foil overlapped with a 0.5" wide strip of the tape formed according to Example 3, with an overlap area of 0.25 square inches. The area of the lap joint was encapsulated with a 1"×1" glass lid and 15 mil fast cure EVA using a cure profile of 150° C. for 15 minutes at 20 psi, which is similar to the profile used in encapsulating a photovoltaic cell. The lap joint sample resistance was measured using a four-point probe geometry. Outer contacts were applied at the non-overlapped ends of the foils and were used to drive a current of 1 amp through the sample. Inner electrodes were placed on either side of the encapsulated lap joint area and were used to measure voltage drop across the lap joint which was converted to lap joint resistance using Ohm's Law. A similar experiment was conducted using a conventional, non-reactive charge collection tape.

Figure 2:
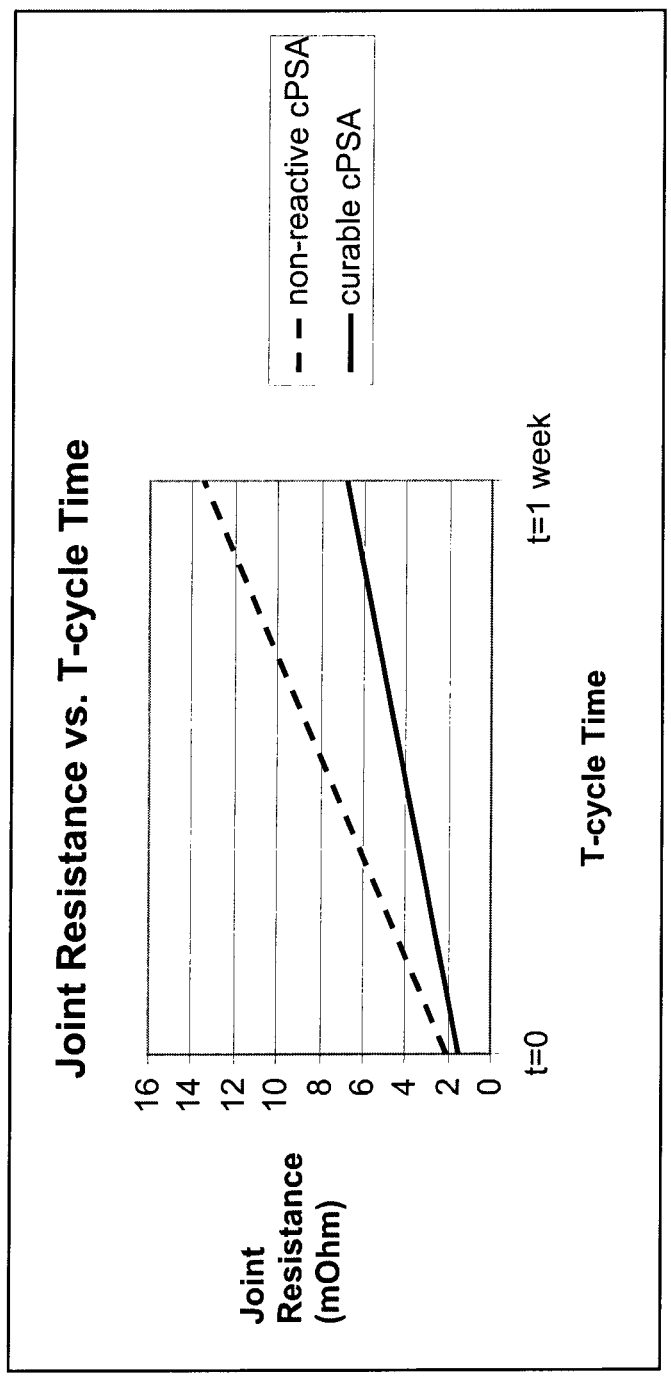
FIG. 2 graphically illustrates overlap joint resistance versus thermal cycling over time of a simulated encapsulated photovoltaic cell.

Lap joint resistance measurements through one week of thermal cycling are shown in FIG. 2. As FIG. 2 graphically illustrates, the tape made according to Example 3 exhibits better stability and reliability compared to the conventional non-reactive conductive PSA as evidenced by the smaller increase in resistance as a result of the thermal cycling for 1 week.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A reactive conductive adhesive tape comprising:
   a reactive adhesive layer comprising:
      a curable pressure sensitive adhesive, and
      a conductive filler; and
   an electrically conductive substrate, wherein the adhesive layer is laminated on and in contact with the electrically conductive substrate,
   wherein the adhesive layer is curable from a pre-cure peel strength greater than 2.7 N/cm as measured at a peel angle of 90° at a rate of 12 in./min on a stainless steel substrate to a post-cure peel strength less than the pre-cure peel strength and still greater than 2.7 N/cm as measured at a peel angle of 90° at a rate of 12 in./min on a stainless steel substrate when the adhesive layer is exposed to a temperature in the range of about 150° C. to about 170° C. at a time period in the range of about 10 to about 15 minutes such that the reactive adhesive layer is curable on a photovoltaic cell during a processing step of a fabrication of the photovoltaic cell without a separate curing processing step; and
   wherein the adhesive layer has a post cure glass transition temperature less than 0° C.

2. The reactive conductive adhesive tape of claim 1, wherein the curable pressure sensitive adhesive comprises a reactive polymer.

3. The reactive conductive adhesive tape of claim 2, wherein the curable pressure sensitive adhesive further comprises a crosslinking component.

4. The reactive conductive adhesive tape of claim 2, wherein the reactive polymer comprises an acrylic copolymer that incorporates one or more functional groups selected from the group consisting of hydroxyl-functional, epoxy, carboxylic acid, amine, mercaptan, amide, isocyanate, cyanate ester, allyl, maleimide, acrylate, oxetane, silicone hydride, alkoxysilane, and combinations thereof, the functional groups being pendant to or within the polymer backbone.

5. The reactive conductive adhesive tape of claim 1, wherein the curable pressure sensitive adhesive comprises a non-reactive base polymer and a crosslinking component.

6. The reactive conductive adhesive tape of claim 5, wherein the non-reactive polymer comprises an acrylic polymer.

7. The reactive conductive adhesive tape of claim 1, wherein the wherein the curable pressure sensitive adhesive comprises a phenolic resin, aliphatic polyester, aromatic polyester, polyether polyol, polyester polyol, amine-functional acrylonitrilebutadiene copolymer, carboxylic acid-functional acrylonitrilebutadiene copolymer, polyurethane, polyamide, rubberized epoxy prepolymer, or hydroxyl-functional acrylonitrilebutadiene polymer.

8. The reactive conductive adhesive tape of claim 1, further comprising a crosslinking component present in about 0.1% by weight to about 70% by weight of the organic solids content of the adhesive.

9. The reactive conductive adhesive tape of claim 8, wherein the crosslinking component is present in about 0.5% by weight to about 20% by weight of the organic solids content of the adhesive.

10. The reactive conductive adhesive tape of claim 8, wherein the crosslinking component has an epoxy, acrylate, oxetane, maleimide, alcohol, mercaptan, isocyanate, cyanate ester, alkoxysilane, silicon-hydride, allyl, or benzoxazine functionality.

11. The reactive conductive adhesive tape of claim 8, wherein the crosslinking component comprises a urethane acrylate, epoxy resin or blocked isocyanate.

12. The reactive conductive adhesive tape of claim 1, wherein the tape has a pre-cure peel strength of at least 4.3 N/cm as measured at a peel angle of 90° at a rate of 12 in./min on a stainless steel substrate.

13. The reactive conductive adhesive tape of claim 1, wherein the conductive filler is present in about 0.1% to about 90% by weight solids of the reactive adhesive layer.

14. The reactive conductive adhesive tape of claim 13, wherein the conductive filler is selected from the group consisting of silver, gold, nickel, copper, carbon black, carbon fiber, metalized carbon fiber, metal coated glass beads, metal coated glass flakes/fibers, metal coated nickel particles and combinations thereof.

15. The reactive conductive adhesive tape of claim 1, wherein the electrically conductive substrate is tin-coated copper foil, aluminum foil, copper foil, metalized plastic, or conductive scrim.

16. The reactive conductive adhesive tape of claim 1, wherein the curable pressure sensitive adhesive comprises a reactive acrylic polymer and a blocked isocyanate.

17. The reactive conductive adhesive tape of claim 1, wherein the curable pressure sensitive adhesive comprises a reactive acrylic polymer and a solid epoxy cross-linking component insoluble in the reactive acrylic polymer.

18. The reactive conductive adhesive tape of claim 1, wherein the curable pressure sensitive adhesive comprises a reactive acrylic polymer, a radically curable oligomeric cross-linking component and a radical initiator.

19. A reactive conductive adhesive tape comprising
a reactive adhesive layer comprising:
   a curable pressure sensitive adhesive comprising a reactive acrylic polymer and a blocked isocyanate wherein blocked isocyanate is present as about 12% to about 15% by weight (solids basis) of the reactive acrylic polymer, and
   a conductive filler; and
an electrically conductive substrate, wherein the adhesive layer is laminated on and in contact with the electrically conductive substrate,
wherein the adhesive layer exhibits a predetermined amount of curing in the range of about 150° C. to about 170° C. at a time period in the range of about 10 to about 15 minutes such that the reactive adhesive layer is curable on a photovoltaic cell during a processing step of a fabrication of the photovoltaic cell without a separate curing processing step; and
wherein the adhesive layer has a post cure glass transition temperature less than 0° C.

* * * * *